United States Patent [19]

Gotoh et al.

[11] Patent Number: 5,593,916
[45] Date of Patent: Jan. 14, 1997

[54] PROCESSING OF GLASS SUBSTRATES USING HOLDING CONTAINER AND HOLDING CONTAINER

[75] Inventors: Yoshihisa Gotoh; Motoo Kawamata, both of Yokohama; Toshiaki Takahashi, Hatano, all of Japan

[73] Assignee: Mitsui Toatsu Chemicals, Incorporated, Tokyo, Japan

[21] Appl. No.: 485,012

[22] Filed: Jun. 7, 1995

Related U.S. Application Data

[63] Continuation of Ser. No. 152,260, Nov. 12, 1993, Pat. No. 5,455,201, which is a continuation of Ser. No. 867,062, Apr. 10, 1992, abandoned, which is a continuation of Ser. No. 595,691, Oct. 4, 1990, abandoned, which is a continuation of Ser. No. 237,739, filed as PCT/JP87/00826, Oct. 21, 1989, abandoned.

[51] Int. Cl.$^6$ .......................... H01L 21/68; H01L 21/469
[52] U.S. Cl. .......................... 437/83; 437/225; 437/247; 437/925; 156/345; 206/711; 206/832; 211/41; 432/261
[58] Field of Search .......................... 432/261; 156/345; 206/459, 711, 832; 211/41; 437/83, 225, 297, 925

[56] References Cited

U.S. PATENT DOCUMENTS

| | | | |
|---|---|---|---|
| 4,611,967 | 9/1986 | Tsutsui . | |
| 4,645,819 | 2/1987 | Sterzel | 528/125 |
| 4,668,744 | 5/1987 | Matzner et al. | 528/125 |
| 4,682,270 | 7/1987 | Whitehead et al. | 361/401 |
| 4,703,102 | 10/1987 | Fukuoka et al. | 528/125 |
| 4,767,838 | 8/1988 | Clendinning et al. | 528/125 |
| 4,784,772 | 11/1988 | Gotoh et al. | 210/638 |
| 4,810,566 | 3/1989 | Kowakami et al. | 428/220 |
| 4,818,812 | 4/1989 | Economy et al. | 528/176 |
| 4,826,297 | 5/1989 | Kubo et al. | 357/80 |
| 4,874,722 | 10/1989 | Bidwarz et al. | 437/214 |
| 5,226,437 | 7/1993 | Kamikawa et al. . | |
| 5,240,753 | 8/1993 | Tabuchi et al. . | |
| 5,370,142 | 12/1994 | Nishi et al. . | |
| 5,376,213 | 12/1994 | Ueda et al. . | |
| 5,421,905 | 6/1995 | Ueno et al. . | |
| 5,429,251 | 7/1995 | Matthews . | |
| 5,455,201 | 10/1995 | Gotoh et al. . | |

FOREIGN PATENT DOCUMENTS

| | | |
|---|---|---|
| 60-147127 | 8/1985 | Japan . |
| 61-090171 | 10/1987 | Japan . |
| 62-276849 | 12/1987 | Japan . |

*Primary Examiner*—George Fourson
*Attorney, Agent, or Firm*—Schmeiser, Olsen & Watts

[57] ABSTRACT

A holding container which is made of a polyether ether ketone resin and is suitable for use in holding one or more substrates upon fabrication of the corresponding number of thin-film semiconductor substrates useful in driving a planar display, for example, a liquid crystal display.

3 Claims, No Drawings

PROCESSING OF GLASS SUBSTRATES USING HOLDING CONTAINER AND HOLDING CONTAINER

This is a continuation of application Ser. No. 08/152,260 filed Nov. 12, 1993, now U.S. Pat. No. 5,455,201, which in turn is a continuation of application Ser. No. 07/867,062, filed Apr. 10, 1992, abandoned, which in turn is a continuation of application Ser. No. 07/595,691 filed Oct. 4, 1990, now abandoned, which in turn is a continuation of the patent application Ser. No. 07/237,739, filed as PCT/JP87/00826, Oct. 21, 1989, now abandoned.

TECHNICAL FIELD

This invention relates to a holding container useful in chemical treatments, processing, washing, transportation, storage and the like upon fabrication of one or more thin-layer semiconductor substrates, which are suitable for driving a planar display, by forming a thin-film semiconductor on each of the substrates.

BACKGROUND ART

The term "planar display" as used herein means those adapted to display an image by using a liquid crystal, plasma display tubes, flight emitting diodes, electroluminescence or the like. Planar displays are used as thin television sets and various displays.

A glass plate, ceramic plate, porcelain-enameled steel plate or the like is used as a substrate. In order to form a semiconductor in the form of a thin film on the substrate so as to fabricate a thin-film semiconductor substrate suitable for use in driving a planar display, a variety of treatments such as various chemical treatments, masking, etching and washing are carried out. As materials of substrate-holding containers employed in such treatments, glass fiber containing polyphenylene sulfide resins (hereinafter abbreviated as "GF-containing PPS resins") and fluorine plastics such as perfluoroalkoxy-substituted polytetrafluoroethylene resin (hereinafter abbreviated as "PFA resin") have heretofore been used.

Liquid-crystal displays, one type of planar displays, are generally composed of two glass substrates, each of which is equipped with a transparent electrode attached thereon, and a liquid crystal layer having a thickness of several micrometers and interposed between the glass substrates. In order to form the transparent electrode on each of the glass substrate, treatments such as washing, masking and etching are conducted. The above-mentioned holding containers have also been used as glass substrate holding containers in such treatments.

A holding container made of a GF-containing PPS resin is however accompanied by drawbacks that the glass fibers in the resin are dissolved by an etching treatment, the resin and glass fiber are caused to separate as fine powder from the surface of the holding container and the fine powder deposits on the surface of the substrate to result in contamination of the substrate surface. Moreover, a holding container made of a fluorine plastic is accompanied by drawbacks that it is prone to a deformation due to its low stiffness, thereby involving a potential problem of accidental drop of substrates in the course of their treatments, and it cannot be used in any step involving heating due to its softening and deformation at elevated temperatures.

DISCLOSURE OF THE INVENTION

An object of this invention is to provide a holding container for a thin-film semiconductor substrate adapted to drive a planar display, which holding container gives off no fine powder compared with conventional holding containers, has excellent heat resistance and can contribute to the improvement of productivity in the fabrication of such thin-film semiconductor substrates.

The present invention relates to a holding container adapted to hold a thin-film semiconductor substrate suitable for use in driving a planar display, characterized in that the container is made of a polyether ether ketone resin.

BEST MODE FOR CARRYING OUT THE INVENTION

The polyether ether ketone resin useful in the practice of this invention is a crystalline thermoplastic aromatic resin having a recurring unit represented by the following formula (I):

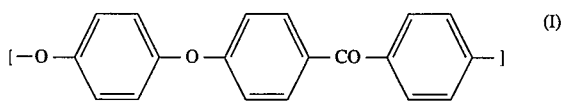

In the present invention, it is preferable to use polyether ether ketone resins having a melt flow index in a range of 1–5 g/10 min as measured at 360° C. and under a load of 2.16 Kg in accordance with ASTM D1238.

Other resins, fillers and/or fibrous reinforcing materials may also be incorporated in such small amounts so long as the object of the present invention is not impaired. The above-described polyether ether ketone resin may be molded or otherwise formed into holding containers of various shapes by a molding or forming technique known commonly in the art, such as injection molding, extrusion molding or transfer molding technique.

The polyether ether ketone resin exhibits characteristics excellent in heat resistance, mechanical properties and chemical resistance even when not reinforced with glass fibers. Therefore, a holding container molded or otherwise formed of this resin has good dimensional accuracy and a light weight. It is free from deformations even at elevated temperatures, is free of the problem of accidental drop of substrates and contributes to the improvement of production yield.

By the term "holding container" as used herein is meant a container which is employed for processing, washing, transporting and otherwise handling one or more substrates made of glass or the like upon fabrication of the corresponding number of thin-film semiconductor substrates suitable for use in driving a planar display, for example, a liquid-crystal display.

Although no particular limitation is imposed on the construction or shape of the holding container, it is equipped basically with two pairs of panels disposed in an opposing relation and defining a plurality of grooves for holding plural substrates spacedly on bars.

The present invention will be described more specifically by the following Examples.

EXAMPLE 1

As a polyether ether ketone resin, "PEEK 450G" (trade name; product of Imperial Chemical Industries, Ltd., England; melt flow index: 3.1 g–5 g/10 rain) was molded by an injection molding machine at a cylinder temperature of 390° C., mold temperature of 170° C. and injection pressure of 1,000 Kg/cm to provide two grooved panels of 175×220 (mm) wide. Those panels were combined with round bars obtained by extrusion molding of the polyether ether ketone resin and having a diameter of 10 mm, thereby constructing a holding container.

Upon fabrication of glass substrates for plasma displays, the holding container constructed as described above and made of the polyether ether ketone resin did not give off fine powder and was employed satisfactorily without deformations even in a 200° C. drying step.

EXAMPLE 2

As a PEEK resin, "PEEK 450G", product of Imperial Chemical Industries, Ltd., England, (trade name; melt flow index: 3.1 g/10 min) was molded by an injection molding machine at a cylinder temperature of 390° C., mold temperature of 170° C. and injection pressure of 1,000 Kg/cm$^2$ to provide two grooved panels of 175×220 (mm) wide. Those panels were combined with round bars obtained by extrusion forming of the PEEK resin and having a diameter of 15 mm, thereby constructing a holding container.

Upon fabrication of glass substrates for liquid-crystal displays, the holding container obtained as described above and made of the PEEK resin did not give off fine powder and was employed satisfactorily without deformations even in a 200° C. drying step.

COMPARATIVE EXAMPLE 1

As a GF-containing PPS resin, "Ryton R-4" (trade name; product of Phillips Petroleum Company) was molded by an injection molding machine at a cylinder temperature of 330° C., mold temperature of 140° C. and injection pressure of 1,000 Kg/cm$^2$ to provide two grooved panels of 175×220 (mm) wide. Those panels were combined with round bars obtained by extrusion forming of the GF-containing PPS resin and having a diameter of 15 mm, thereby constructing a holding container.

Upon fabrication of glass substrates for plasma displays, the holding container obtained as described above and made of the GF-containing PPS resin was dissolved in the surface thereof in an etching step so that fine powder was caused to occur.

COMPARATIVE EXAMPLE 2

Upon fabrication of glass substrates for plasma displays, a commercial holding container manufactured by Fluoroware Corporation and made of a PFA resin was deformed in a 200° C. drying step and the glass substrates fell down in a solution-removing step making use of a centrifuge.

COMPARATIVE EXAMPLE 3

Upon fabrication of glass substrates for liquid-crystal displays, the holding container obtained in Comparative Example 1 and made of the GF-containing PPS resin was dissolved in the surface thereof in an etching step so that fine powder was caused to occur.

COMPARATIVE EXAMPLE 4

Upon fabrication of glass substrates for liquid-crystal displays, a commercial holding container manufactured by Fluoroware Corporation and made of a PFA resin was deformed in a 200° C. drying step and the glass substrates fell down in a solution-removing step making use of a spin drier.

Holding containers of this invention, which is made of a polyether ether ketone resin, give off no fine powder compared with conventional holding containers made of a GF-containing PPS resin or fluorine plastic and are excellent in heat resistance. Accordingly, they contribute to the improvement of the productivity of the fabrication of substrates for planar displays.

We claim:

1. A process for fabricating a substrate of a glass plate, ceramic plate, or a porcelain-enameled plate for a thin-film semiconductor while the substrate is being held in a holding container comprising the steps of:

placing the substrate in a holding container comprising two panels which are disposed in opposing relation to each other and define a plurality of grooves for holding the substrates spacedly, the holding container being made of polyether ether ketone having a recurring unit:

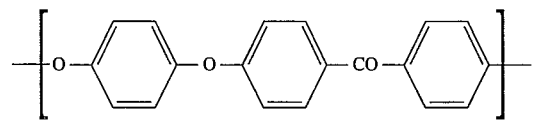

and having a melt flow index of 1–5 g/10 minutes at 360° C. under a load of 2.16 kg in accordance with ASTM D 1238;

subjecting the container holding the substrate to chemical treatments, masking, and etching without giving off fine powder;

washing the substrates and then subjecting the substrates to heat drying without deformation of the holding container, even in a 200° C. drying step; and forming a semiconductor on the substrates in a form of thin film.

2. The process according to claim 1 wherein the polyether ether ketone is not reinforced with glass fibers.

3. A strong, light weight, abrasion-, deformation-, etch-, and heat-resistant holding container for holding glass plate, ceramic plate, and porcelain-enameled steel plate substrates during chemical treatments, processing including masking, etching, washing, and heat drying, transportation and storage, said container comprising a PEEK resin having a recurring unit characterized by the form:

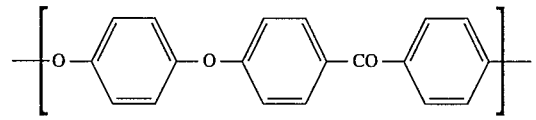

said resin molded to a shape defined by two opposing planar panels having a plurality of grooves therein and spaced by a plurality of round bars that are extrusion molded of said PEEK resin, the bars having a diameter of about 10–15 mm, wherein the PEEK resin has a melt flow index in the range of 1–5 g/10 minutes as measured at 360° C. and under a load of 2.16 Kg in accordance with ASTM D 1238, the grooved panels having a dimension of about 175×220 mm, whereby said container resists abrasion by said substrates and resists deformation even in a 200° C. drying step.

* * * * *